(12) United States Patent
Doi et al.

(10) Patent No.: US 6,924,722 B2
(45) Date of Patent: Aug. 2, 2005

(54) MAGNETIC CIRCUIT WITH OPPOSING PERMANENT MAGNETS

(75) Inventors: Yuhito Doi, Takefu (JP); Koji Miyata, Takefu (JP); Dai Higuchi, Takefu (JP)

(73) Assignee: Shin-Etsu Chemical Co., Ltd. (JP)

( * ) Notice: Subject to any disclaimer, the term of this patent is extended or adjusted under 35 U.S.C. 154(b) by 0 days.

(21) Appl. No.: 11/006,874

(22) Filed: Dec. 8, 2004

(65) Prior Publication Data

US 2005/0128036 A1 Jun. 16, 2005

(30) Foreign Application Priority Data

Dec. 12, 2003 (JP) ........................................ 2003-414031

(51) Int. Cl.[7] .............................................. H01F 7/02
(52) U.S. Cl. .................... 335/296; 335/302; 335/306
(58) Field of Search ................................ 335/296–306; 324/318–320

(56) References Cited

U.S. PATENT DOCUMENTS

| | | | | |
|---|---|---|---|---|
| 4,401,960 A | * | 8/1983 | Uchikune et al. | ........... 335/285 |
| 4,675,609 A | * | 6/1987 | Danby et al. | ................ 324/318 |
| 4,777,464 A | * | 10/1988 | Takabatashi et al. | ........ 335/306 |
| 5,055,812 A | | 10/1991 | Abele et al. | ................ 335/210 |

FOREIGN PATENT DOCUMENTS

| | | |
|---|---|---|
| JP | 8339916 | 12/1996 |
| JP | 0978727 A3 | 2/2000 |

* cited by examiner

Primary Examiner—Ramon M. Barrera
(74) Attorney, Agent, or Firm—Myers Bigel Sibley & Sajovec, P.A.

(57) ABSTRACT

To reduce the cost of the magnet of magnetic circuits with opposing permanent magnets by ensuring that inexpensive magnets having a low coercive force can be used without substantial loss of magnetism caused by demagnetization fields, there is provided a magnetic circuit with opposing permanent magnets, comprising: a pair of permanent magnet units opposing each other across a gap, the pair of permanent magnets being magnetized in thickness direction, wherein each of the permanent magnet units comprises at least two types of permanent magnet pieces with different coercive forces, and wherein, the permanent magnet piece that receives the largest demagnetization force when the permanent magnet units are manufactured has a larger coercive force than at least one other type of the permanent magnet piece; a yoke magnetically coupled to the permanent magnet units, and provided outside of the permanent magnet units and the gap; and a pair of pole pieces each arranged on a gap side of an opposing surface of each of the permanent magnet units and having a peripheral projection in opposing direction.

7 Claims, 2 Drawing Sheets

MAGNETIC CIRCUIT WITH OPPOSING PERMANENT MAGNETS

RELATED APPLICATION

This application claims priority from Japanese Patent Application No. 2003-414031, filed Dec. 12, 2003, the disclosure of which is incorporated by reference herein in its entirety.

BACKGROUND OF THE INVENTION

1. Field of the Invention

The present invention relates to magnetic circuits with opposing permanent magnets, and specifically relates to magnetic circuits with opposing permanent magnets suitable for magnetic resonance imaging apparatuses (also referred to MRI) which obtain images of bodies by utilizing magnetic resonance.

2. Description of Related Art

For magnetic field generating devices using permanent magnets for magnetic resonance apparatuses, the use of magnetic circuits with opposing permanent magnets utilizing rare earth magnets is well-established. As detailed below, such magnet opposing-type magnetic circuits include permanent magnet units and a yoke for allowing a magnetic flux from the magnets to pass therethrough, and generally also include pole pieces that are preferably made of soft magnetic material such as soft iron, provided on surfaces of the permanent magnet units in order to generate a uniform magnetic field in the gap between the permanent magnet units.

Japanese Patent Provisional Publication No. 2000-51175 A, Japanese Patent Provisional Publication No. H8-339916/1996 A, all of which are herein incorporated by reference, and the like teach a method for assembling such magnetic circuits with opposing permanent magnets. As disclosed in these documents, when assembling magnetic circuits with opposing permanent magnets, a permanent magnet unit is arranged on a base yoke in a plate-shaped, disk-shaped or the like, followed by arranging a pole piece on an upper face of the permanent magnet unit.

Before the pole piece is arranged on the permanent magnet unit, the permanent magnet is very susceptible to a self-generated magnetic field (demagnetization field). Therefore, if the coercive force of the permanent magnet is weak, then magnetism may be reduced due to the demagnetization field, resulting in reduction of the magnetic field generated by the permanent magnet, and there is a possibility that the obtained magnetic field will be less than the design value even after a pole piece is arranged. Thus for the permanent magnet used in the magnet circuit, it has been necessary to use a permanent magnet whose coercive force is sufficiently high. However, special materials and technologies are required for manufacturing a magnet having a high coercive force. $Nd_2Fe_{14}B$-based rare earth magnets are used as the permanent magnets for magnetic circuits with opposing permanent magnets currently widely used. However, further adding elements such as Dy and Tb is required in order to raise the coercive force of the magnets. The use of these added elements causes an increase in the cost of the magnet, resulting in an increase in costs of the magnetic circuit.

SUMMARY OF THE INVENTION

It is an object of the present invention to reduce the cost of the magnet of magnetic circuits with opposing permanent magnets by ensuring that inexpensive magnets having a low coercive force can be used without substantial loss of magnetism caused by demagnetization fields.

There is provided a magnetic circuit with opposing permanent magnets, comprising: a pair of permanent magnet units opposing each other across a gap, the pair of permanent magnets being magnetized in thickness direction, wherein each of the permanent magnet units comprises at least two types of permanent magnet pieces with different coercive forces, and wherein, the permanent magnet piece that receives the largest demagnetization force when the permanent magnet units are manufactured has a larger coercive force than at least one other type of the permanent magnet piece; a yoke magnetically coupled to the permanent magnet units, and provided outside of the permanent magnet units and the gap; and a pair of pole pieces each arranged on a gap side of an opposing surface of each of the permanent magnet units and having a peripheral projection in opposing direction.

As described above, conventionally, magnets whose magnetism is not reduced by an demagnetization field before the pole piece is arranged during assembly of the magnetic circuit, namely magnets having high coercive forces, are used. However, the strength of the demagnetization field is dependent on its position. For example, in a disk-shape magnet, the demagnetization field is particularly strong at a position in the vicinity of its center. Thus, the present inventors found that it is possible to use a magnet having a high coercive force only in the region that receives a strong demagnetization field, and to use a magnet having a small coercive force in the other regions.

In this manner, the present invention defines the region which demands a magnet having high coercive force, and an inexpensive magnet having a low coercive force can be used in the other regions. Thus, it is possible to reduce the cost of the magnet of the magnetic circuit without substantial reduction in magnetism caused by demagnetization fields.

DETAILED DESCRIPTION OF PREFERRED EMBODIMENTS

An embodiment of the present invention is described below with reference to the attached drawings. Naturally, the embodiment that is described below does not limit the present invention.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise.

Unless otherwise defined, all technical and scientific terms used herein have the same meaning as commonly understood by one of ordinary skill in the art to which this invention belongs.

Figure 1:
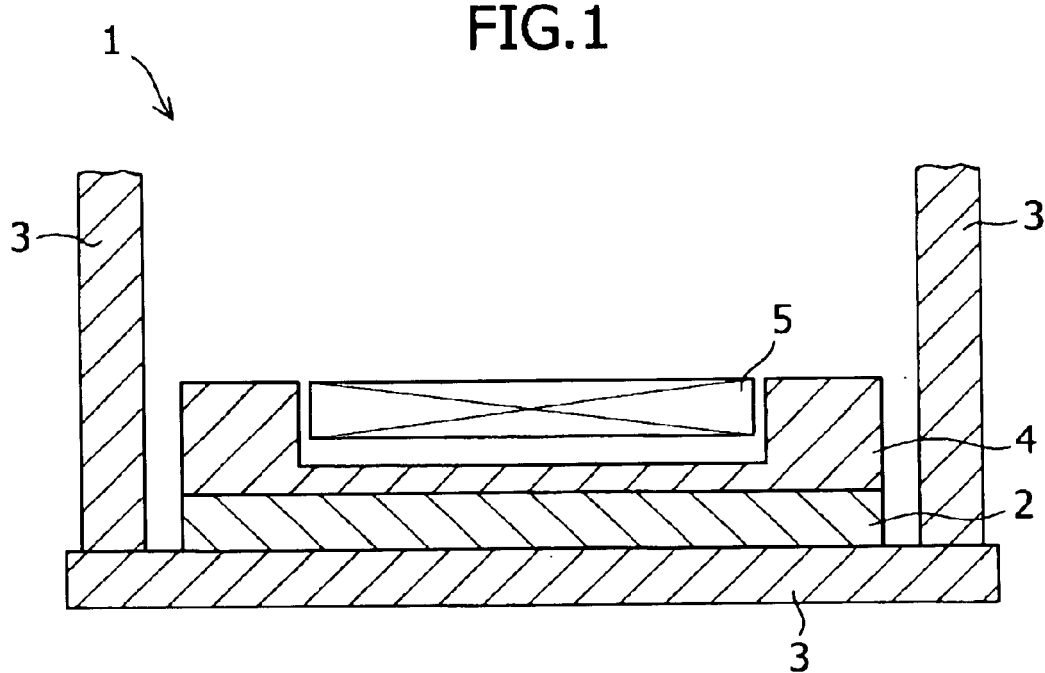
FIG. 1 shows a schematic view of a permanent magnet opposing-type magnetic circuit, according to an embodiment of the present invention.

FIG. 1 shows a schematic view of the permanent magnet opposing-type magnetic circuit, according to an embodiment of the present invention. FIG. 1 shows only the lower portion of the permanent magnet opposing-type magnetic circuit, since generally, an upper portion and a lower portion of the permanent magnet opposing-type magnetic circuit can be symmetrical. However, even if the upper and lower portions are asymmetric, the present invention can be applied if the configuration is the same. As shown in FIG. 1, a permanent magnet opposing-type magnetic circuit 1 according to the present invention includes a pair of permanent magnet units 2 opposing each other access a gap and magnetized in the thickness direction, a yoke 3 magnetically coupled to the permanent magnet units and provided outside of the permanent magnet units and the gap, and a pair of pole pieces 4 arranged on a gap side of an opposing surface of each of the permanent magnet units and having a peripheral projection in opposing direction.

As described above, a permanent magnet opposing-type magnetic circuit 1 according to the present invention includes a pair of permanent magnet units opposing each other access a gap and magnetized in the thickness direction to form the principal magnetic field in the gap. The direction of magnetization of the permanent magnet units is substantially perpendicular to the faces of the opposing permanent magnet units (thickness direction), and generally points in the same direction. The shape of the permanent magnet units may be round or square, for example, and although it is not a specific limitation, it is preferable that the permanent magnet units have the same shape as the pole pieces.

Furthermore, as described above, the permanent magnet unit according to the present invention comprises at least two types of permanent magnet pieces with different coercive forces. In other words, the permanent magnet unit according to the present invention has a region of relatively high coercive force (also referred to as a high coercive force region), and a region of relatively low coercive force (also referred to as a low coercive force region). It is preferable that each of the at least two types of permanent magnets is arranged depending on the degree of the demagnetization force that each permanent magnet piece will receive during manufacture of the permanent magnet unit. Here, arranged depending on the degree of the demagnetization force, means providing the high coercive force region in the region which receives relatively large demagnetization force during manufacture of the permanent magnet unit, and providing the low coercive force region in at least a part of, and preferably the entirety of the region which receives relatively small demagnetization force. More specifically, it is preferable that the permanent magnet piece that receives the large demagnetization force has a larger coercive force than at least one other type of the permanent magnet piece during manufacture of the permanent magnet unit.

By containing such a high coercive force region and low coercive force region, an inexpensive magnet having low coercive force can be used to manufacture the permanent magnet unit without substantial loss of magnetism due to the demagnetization field, and the cost of the permanent magnet required to manufacture the magnetic circuit can be reduced. Namely, the permanent magnet unit according to the present invention can be manufactured without substantial reduction in magnetism caused by the demagnetization field, because the permanent magnet piece that receives relatively large demagnetization force has high coercive force. On the other hand, for the permanent magnet unit according to the present invention, since the permanent magnet piece that receives relatively low demagnetization force has a low coercive force, there is no necessity to use a magnet whose coercive force is high and which requires special materials or technology when manufacturing this permanent magnet piece, and thus the cost of the permanent magnet needed to manufacture the magnetic circuit can be reduced.

Here, when manufacturing the permanent magnet unit, the high coercive force region and the low coercive force region can be determined at the design stage. It is already standard practice to use magnetic field analysis during the design, and at this time it is possible to determine the operating points of the parts of the magnet unit, namely the magnetic flux density and the demagnetization field can be determined at that position. The magnet unit can be designed generally so that there is no reduction in the magnetic field, provided that the operating point is above the knick point (the point at which the slope of the curve curves downward) of the BH curve of the magnet. The BH curve is substantially determined by the remnant flux density and coercive force of the magnet. When magnets with the same remnant flux density are placed in the same position of the magnet unit, since the magnet having larger coercive force has a larger magnetic field which shows knick point, the magnet of larger coercive force can withstand a higher demagnetization field. The operating point of the parts of the magnet unit depends on the shape of the magnet unit, and the region that receives and does not receive the high demagnetization force is substantially continuously distributed.

For example, although it is not a specific limitation, it is preferable that the region where there is the possibility of a substantial reduction in the coercive force in case of the permanent magnet piece of the low coercive force region due to the demagnetization force received during manufacture of the permanent magnet unit, and which receives larger demagnetization field than the knick point of the magnet of small coercive force is the high coercive force region; and that the rest of the region which receives small demagnetization field is the low coercive force region. This is because, even when the low coercive force region is constituted by an inexpensive permanent magnet material that does not require special material or technology, if it does not receive smaller demagnetization field than the knick point of the magnet having small coercive force, there is no possibility of a substantial loss of the magnetism in the region.

It is preferable that all of the at least two types of permanent magnet pieces have a coercive force that is large enough such that there is no substantial reduction in magnetism due to the demagnetization force received by the permanent magnetic pieces during manufacture of the permanent magnetic unit. It should be noted that in the specification, no substantial reduction in magnetism, means a case in which even after receiving an demagnetization force, the permanent magnet unit has a sufficient large magnetic flux density so that the magnetic circuit can demonstrate a sufficiently large magnetic field strength, and that its function as a magnetic circuit is not lost. More specifically, although it is not a specific limitation, no substantial reduction in magnetism means a case in which, after receiving the demagnetization force, when the demagnetization force is eliminated, the permanent magnet unit preferably still has at least 97% of the original magnetic flux density before receiving the demagnetization force.

Figure 2:
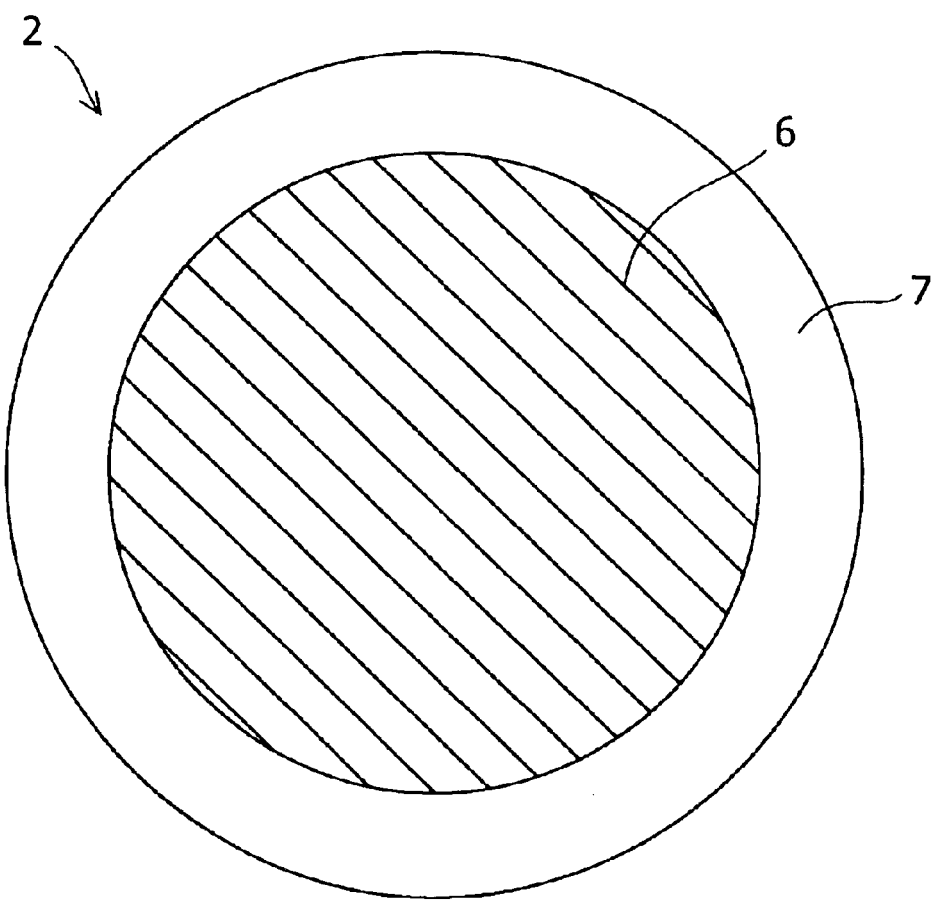
FIG. 2 is a schematic view showing the high coercive force region and the low coercive force region of the permanent magnet unit according to the present invention.

FIG. 2 is a schematic view showing the high coercive force region and the low coercive force region of the permanent magnet unit according to the present invention. More specifically, as illustrated in FIG. 2, it is preferable that the region of the central portion of the permanent magnet unit is the high coercive force region, and that at least a part, and preferably the entirety of the other region is the low coercive force region. As described above, this is because the magnet receives the largest demagnetization field at the stage before the pole pieces are arranged when assembling the magnetic circuit, and the demagnetization field received at this time has a distribution, and is particularly large in the region of the central portion of the permanent magnet unit. Although not particularly limiting, the high coercive force region is preferably the central portion of the permanent magnet unit, preferably has at least 60% and less than 100% of the area of the opposing face of the permanent magnet unit, and more preferably at least 70% and at most 80% of the area of the central portion. This is because the region in this range receives a particularly large demagnetization force when manufacturing the permanent magnet unit. Furthermore, as described above, it is preferable to set the entirety of the region other than the central portion (peripheral portion) to be the low coercive force region, since this enables the maximum magnet cost reduction, however it is not necessary that the entirety of the peripheral portion is a low coercive force region, and it is possible that only a portion of the peripheral region is a low magnetic force region and the rest of the region is a high coercive force region. It should be noted that, the central portion of the permanent magnet unit, for example in the case of the central 60% portion of the permanent magnet unit, means a region that has 60% of the area of the permanent magnet unit, and is a similar shape as the permanent magnet unit, and has the same center of gravity as the permanent magnet unit.

Although it is not a specific limitation, it is preferable that at room temperature (preferably 25° C.), the coercive force of the permanent magnet piece of the high coercive force region satisfies Formula 1 given below, and even more preferable that it has a coercive force of at least 850 kA/m. This is because although particularly if the magnetic circuit is used an MRI, generally, the principle magnetic field has a magnetic field strength of at least 0.1 T and the permanent magnet that forms the principal magnetic field of the magnetic circuit has a remnant flux density of at least 1.2 T, when this is satisfied, there is no possibility that the magnetic field of the permanent magnet unit will be substantially reduced by the demagnetization force. It should be noted that the coercive force (bHc) and the remnant flux density (Br) are measured in accordance with JIS (Japanese Industrial Standard) C 2501, and, for example, can be measured by a BH tracer.

$$\text{Coercive force (kA/m)} \leq 636.6 \times \text{Remanant flux density (T)} \quad \text{(Formula 1)}$$

The coercive force of the permanent magnet piece in the low coercive force region can have any value less than the coercive force of the permanent magnet piece in the high coercive force region, without particular limitation. Particularly, it is preferable that the coercive force of the low coercive force region is a coercive force of a common magnetic material that can be inexpensively obtained and whose manufacture does not demand special material or technology. For example, although it is not a specific limitation, it is possible that the coercive force in the low coercive force is at least 700 kA/m and less than the coercive force of the high coercive force region.

Furthermore, although it is not a specific limitation, it is generally preferable to select a rare earth permanent magnet such as, for example, a $Nd_2Fe_{14}B$-based rare earth permanent magnet as the permanent magnet material suitable for the permanent magnet unit according to the present invention. Particularly, it is preferable that the permanent magnet material used in the high coercive force region is a $Nd_2Fe_{14}B$-based rare earth permanent magnet which further contains additional element, such as dysprosium (Dy), terbium (Tb), praseodymium (Pr), gallium (Ga), molybdenum (Mo) and/or vanadium (V) in addition with the principal components. These are in order to further increase the coercive force. On the contrary, it is preferable that the permanent magnet material used for the low coercive force region is the magnet material described above that does not include the additional element such as Dy and Tb or those in which these element is reduced. This is because that by not including, or reducing these high priced elements it is possible to manufacture the low coercive force region at low cost. The permanent magnet material can be manufactured by any known method.

As described above, a magnetic circuit with opposing permanent magnets according to the present invention, comprises a yoke magnetically coupled to the permanent magnet units, and provided outside of the permanent magnet units and the gap. Thus, a closed magnetic circuit is formed. Since the yoke 3 can be the same as a conventional ones, a detailed description is hereby omitted. There is not particular limitation to the shape of the yoke and it can be any, for example, it can be letter-C-shaped, square, or be shaped as two columns. More specifically, a pair of substantially parallel plate-shaped yokes can be supported by column-shaped yokes, and the permanent magnets can be provided on opposing faces of the plated-shaped yokes.

As described above, a magnetic circuit with opposing permanent magnets according to the present invention, comprises a pair of pole pieces each arranged on a gap side of an opposing surface of each of the permanent magnet units and having a peripheral projection in opposing direction. This improves the uniformity of the magnetic field of the magnetic circuit. Namely, if a spherical or elliptical space (also referred to as an evaluation space) is theoretically provided in the central portion of the gap, and the uniformity of the magnetic field of the magnetic circuit is evaluated according to the magnetic field distribution in the evaluation space, then when the pole pieces are simple disk-shapes, the magnetic field strength at the equatorial portion of the evaluation space is lower than at the pole portions. On the other hand, if pole pieces is provided with peripheral projection, then the physical distance between the equatorial portion of the evaluation space and the peripheral projection is closer, the magnetic field strength increases at the equatorial portion, and thus the uniformity of the magnetic field improves across the entire evaluation space. The pole pieces 4 may be the same as conventional ones and thus a detailed description is hereby omitted. Furthermore, in order to further improve the uniformity of the magnetic field, a plurality of small projections whose step is smaller than that of the peripheral projection can be provided on a periphery of a base portion of the pole pieces.

In addition, it is preferable that a magnetic circuit with opposing permanent magnets according to the present invention, further comprises a pair of inclined magnetic field coils 5 each arranged on a gap side of an opposing surface of each of the pole pieces and inside the peripheral projection, and opposing each other across the gap. The uniformity of the magnetic field of the uniform magnetic field space between the gap of the pole pieces can be intentionally, linearly disrupted by the inclined magnetic field coil. Provided that NMR signals including the non-uniform magnetic field are received at this time, spatial information can also be provided when the signal is converted to an image.

Figure 3:
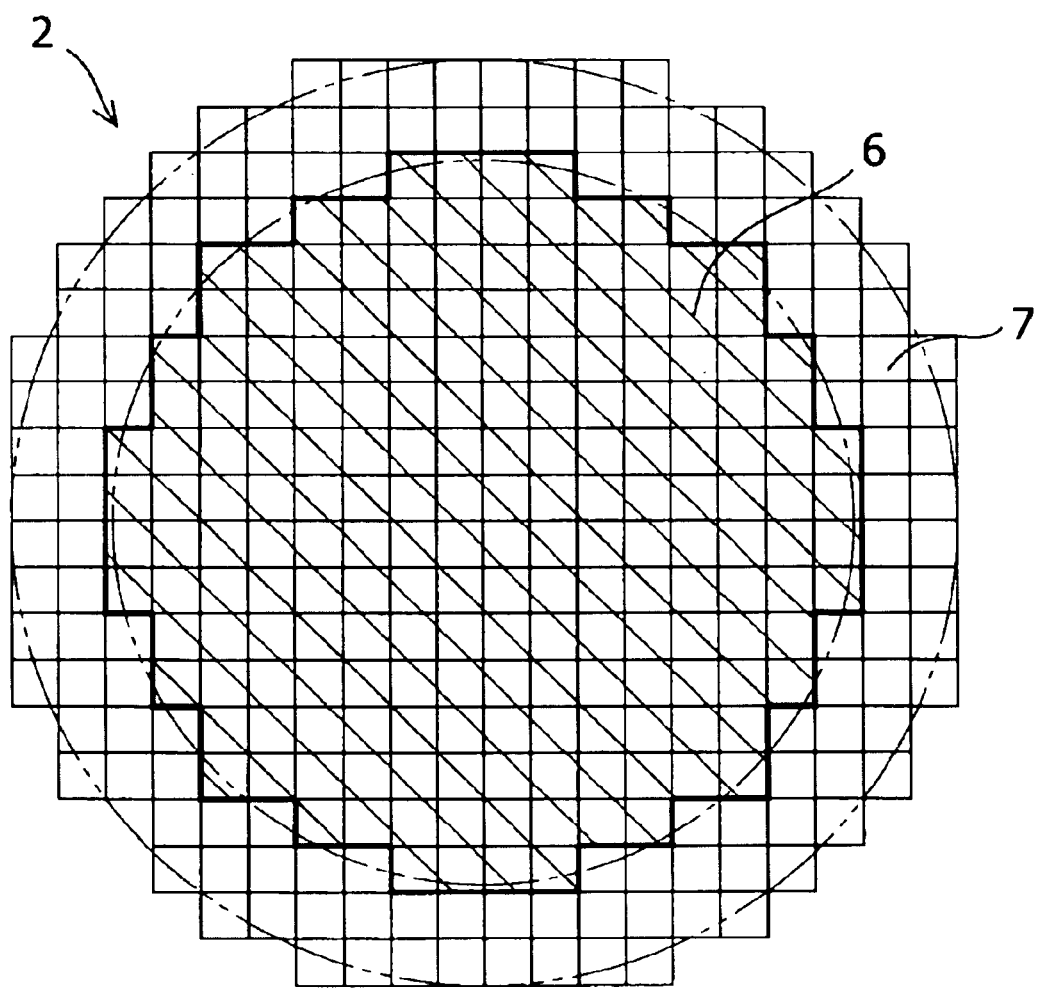
FIG. 3 is a schematic view showing the relationship between the permanent magnet piece and the high and low coercive force region.

Although it is not a specific limitations, the permanent magnet unit according to the present invention can be manufactured by methods described in Japanese Patent Provisional Publication No. 2000-51175 A and Japanese Patent Provisional Publication No. H8-339916/1996 A. As described in these documents, the permanent magnet unit can be configured with a plurality of permanent magnet pieces, for example cubes whose sides are in the order of 25 mm to 100 mm. In this case, the regions described above can be corresponded to the permanent magnet pieces as follows. Namely, the above-described regions can be set as regions occupied by permanent magnet pieces of which at least half the area of the region is occupied by the above-described regions. More specifically, a specific permanent magnet piece is included in a specific region may be defined to mean the case in which at least half the area of the permanent magnet piece is included in the region. The relationship between the permanent magnet piece and the region is shown in FIG. 3. As illustrated in FIG. 3, the central portion of the permanent magnet unit can be constituted by the high coercive force permanent magnet piece (high coercive force region 6) and the other region can be constructed by the permanent magnet piece of a low coercive force (low coercive force region 7).

EXAMPLES

A working example of the present invention is described below with reference to the attached drawings. Naturally, the working example that is described below does not limit the present invention.

In the present working example, the magnetic circuit with opposing permanent magnets illustrated in FIG. 1 was used, whose magnetic field strength is 0.2 T, and whose gap between the upper and lower inclined magnetic field coils is 400 mm. For the upper and lower permanent magnet units, a permanent magnet piece made from a permanent magnet material of a type shown in Table 1 below was used. The characteristics of the permanent magnet material (remnant flux density and coercive force), are obtained by measuring with a sample cut from the magnet block in accordance with JIS C 2501 by a BH tracer.

TABLE 1

Characteristics of magnet material

| Type | Remanent flux density (T) | Coercive force (kA/m) | Coercive force/ Remanent flux density |
|---|---|---|---|
| High coercive force type | 1.32 | 955 | 723.5 |
| Normal type | 1.32 | 820 | 621.2 |

High coercive force type: $Nd_2Fe_{14}B$-based rate earth magnet manufactured by Shin-Etsu Chemical Co. This high coercive force type magnet contains twice as much Dy and Tb as the normal type.

Normal type: $Nd_2Fe_{14}B$-based rate earth magnet manufactured by Shin-Etsu Chemical Co.

The values of coercive force and the remnant flux density shown are as at 25° C.

As the Working Example 1, a magnet circuit constituted by a high coercive force type magnet in 70% of the central portion of the permanent magnet units and a normal type in the rest of the region was used. In addition, a magnetic circuit in which the entire region of the permanent magnet units is constituted by a high coercive force type magnet was used as Comparative Example 1, and a magnet in which the entire region of the permanent magnet unit is constituted by a normal type magnet was used as Comparative Example 2. Table 2 shows the magnetic field strength (T) and the cost of the magnets necessary to constitute magnetic circuits of Working Example 1 and of Comparative Examples 1 and 2, wherein the cost of Comparative Example 1 is given as 100. The magnetic field strength of the magnetic circuit were measured at a position at the center of the gap using a METROLAB NMR Tesla Meter PT2025.

TABLE 2

Magnetic field strength of the magnetic circuits

| | Configuration | Magnetic field strength (T) | Magnet cost |
|---|---|---|---|
| Comparative Example 1 | High coercive force type only | 0.2030 | 100 |
| Working Example 1 | High coercive force type in 70% of center portion, normal type elsewhere | 0.2035 | 96 |
| Comparative Example 2 | Normal type only | 0.1852 | 90 |

As shown in Table 2, according to the present invention, by configuring only the central portion of the permanent magnet unit with a magnet whose coercive force is high, and the rest of the region with a magnet whose coercive force is low, the cost of the magnet can be reduced by 4%, compared to that of the permanent magnet unit whose entire region is constituted by a magnet whose coercive force is high, and it is possible to generate a magnetic field strength of the same level as that of the permanent magnet using whose entire region is constituted by magnet whose coercive force is high. On the other hand, when the entire region of the permanent magnet unit was constituted by a magnet whose coercive force is low, there was a reduction in magnetism during assembling the permanent magnet unit, and the design value of the magnetic field of at least 0.2 T could not be obtained.

It should be understood that the foregoing disclosure emphasizes certain specific embodiments of the invention and that all modifications or alternatives equivalent thereto are within the spirit and scope of the invention as set forth in the appended claims.

In the claims:

1. A magnetic circuit with opposing permanent magnets, comprising:
    a pair of permanent magnet units opposing each other across gap, the pair of permanent magnets being magnetized in thickness direction, wherein each of the permanent magnet units comprises at least two types of permanent magnet pieces with different coercive forces, and wherein, the permanent magnet piece that receives the largest demagnetization force when the permanent magnet units are manufactured has a larger coercive force than at least one other type of the permanent magnet piece;
    a yoke magnetically coupled to the permanent magnet units, and provided outside of the permanent magnet units and the gap; and
    a pair of pole pieces each arranged on a gap side of an opposing surface of each of the permanent magnet units and having a peripheral projection in opposing direction.

2. The magnetic circuit with opposing permanent magnets according to claim 1, wherein the coercive force of the permanent magnet piece that receives the largest demagnetization force satisfies Formula 1 at room temperature:

$$\text{Coercive force (kA/m)} \leq 636.6 \times \text{Remanant flux density (T)} \quad \text{(Formula 1)}$$

3. The magnetic circuit with opposing permanent magnets according to claim 1, wherein a region occupied by the permanent magnet piece that receives the largest demagnetization force is at a central portion of the permanent magnet unit, and has at least 60% and less than 100% of the area of the opposing face of the permanent magnet unit.

4. The magnetic circuit with opposing permanent magnets according to claim 1, wherein said permanent magnet piece that receives the largest demagnetization force is a $Nd_2Fe_{14}B$-based rare earth magnet containing dysprosium and/or terbium; and said at least one other type of permanent magnetic piece is a $Nd_2Fe_{14}B$-based rare earth magnet containing less dysprosium and/or terbium than said permanent magnet piece that receives the largest demagnetization force.

5. The magnetic circuit with opposing permanent magnets according to claim 2, wherein a region occupied by the permanent magnet piece that receives the largest demagnetization force is at a central portion of the permanent magnet unit, and has at least 60% and less than 100% of the area of the opposing face of the permanent magnet unit.

6. The magnetic circuit with opposing permanent magnets according to claim 2, wherein said permanent magnet piece that receives the largest demagnetization force is a $Nd_2Fe_{14}B$-based rare earth magnet containing dysprosium and/or terbium, and said at least one other type of permanent magnetic piece is a $Nd_2Fe_{14}B$-based rare earth magnet containing less dysprosium and/or terbium than said permanent magnet piece that receives the largest demagnetization force.

7. The magnetic circuit with opposing magnets according to claim 3, wherein said permanent magnet piece that receives the largest demagnetization force is a $Nd_2Fe_{14}B$-based rare earth magnet containing dysprosium and/or terbium; and said at least one other type of permanent magnetic piece is a $Nd_2Fe_{14}B$-based rare earth magnet containing less dysprosium and/or terbium than said permanent magnet piece that receives the largest demagnetization force.

* * * * *